United States Patent
Beckley et al.

(10) Patent No.: US 7,883,826 B2
(45) Date of Patent: *Feb. 8, 2011

(54) NEGATIVE-WORKING RADIATION-SENSITIVE COMPOSITIONS AND IMAGEABLE MATERIALS

(75) Inventors: Scott A. Beckley, Windsor, CO (US); Ting Tao, Fort Collins, CO (US); Jianbing Huang, Trumbull, CT (US)

(73) Assignee: Eastman Kodak Company, Rochester, NY (US)

( * ) Notice: Subject to any disclaimer, the term of this patent is extended or adjusted under 35 U.S.C. 154(b) by 520 days.

This patent is subject to a terminal disclaimer.

(21) Appl. No.: 11/567,782

(22) Filed: Dec. 7, 2006

(65) Prior Publication Data
US 2008/0138741 A1 Jun. 12, 2008

(51) Int. Cl.
*G03C 1/00* (2006.01)
*G03F 7/26* (2006.01)

(52) U.S. Cl. ............... 430/270.1; 430/916; 430/914; 430/281.1; 430/286.1; 430/302; 522/904

(58) Field of Classification Search ............... 430/270.1, 430/916, 914, 904, 281.1, 286.1
See application file for complete search history.

(56) References Cited

U.S. PATENT DOCUMENTS

| 5,888,696 | A | * | 3/1999 | Hirano et al. | 430/272.1 |
|---|---|---|---|---|---|
| 5,942,372 | A | * | 8/1999 | West et al. | 430/281.1 |
| 5,998,091 | A | | 12/1999 | Suzuki | |
| 6,087,062 | A | | 7/2000 | Cunningham et al. | |
| 6,599,676 | B2 | * | 7/2003 | Savariar-Hauck et al. | 430/270.1 |
| 7,189,494 | B2 | * | 3/2007 | Knight et al. | 430/281.1 |
| 7,429,445 | B1 | * | 9/2008 | Munnelly et al. | 430/278.1 |
| 2004/0067434 | A1 | * | 4/2004 | Kano et al. | 430/270.1 |
| 2005/0003285 | A1 | | 1/2005 | Hayashi et al. | |
| 2005/0260509 | A1 | * | 11/2005 | West et al. | 430/12 |
| 2008/0070152 | A1 | * | 3/2008 | Yu et al. | 430/270.1 |

FOREIGN PATENT DOCUMENTS

JP 2002-116539 4/2002
JP 2005-062482 3/2005

OTHER PUBLICATIONS

A.M.Sarker et al. "Synthesis and Characterization of a Novel Polymeric System Bearing a Benzophenone Borate Salt as a New Photoinitiator for UV Curing", *Macromolecules* 1996, 29, Am Chem Soc, pp. 8047-8052.
A.Mejiritski et al., "Novel Photoimaging System Based on Photoinduced Electron Transfer in Polymers Containing Pendant Benzophenone-Borate Salts", *Chem. Mater.* 1996, 8, Amer Chem Soc pp. 1360-1362.
U.S. Appl. No. 11/138,026, filed May 26, 2005, titled "On-Press Developable Imageable Element Comprising a Tetraarylborate Salt", by E. Knight et al.
U.S. Appl. No. 11/349,376, filed Feb. 7, 2006, titled "Negative-Working Radiation-Sensitive Compositions and Imageable Materials" by T.Tao et al.
U.S. Appl. No. 11/356,518, filed Feb. 17, 2006, titled "Radiation-Sensitive Compositions and Imageable Materials" by T.Tao et al.

* cited by examiner

*Primary Examiner*—Cynthia H Kelly
*Assistant Examiner*—Connie P Johnson
(74) *Attorney, Agent, or Firm*—J. Lanny Tucker

(57) ABSTRACT

A radiation-sensitive composition and negative-working imagable element includes a polymeric binder that has a hydrophobic backbone and pendant salt groups that comprise a cation covalently attached to the hydrophobic backbone and a boron-containing anion forming a salt with the cation. The use of these particular polymers provides fast digital speed (high imaging sensitivity) and good printability (good shelf-life) even when the preheat step normally used between exposure and development, is omitted.

10 Claims, No Drawings

NEGATIVE-WORKING RADIATION-SENSITIVE COMPOSITIONS AND IMAGEABLE MATERIALS

FIELD OF THE INVENTION

This invention relates to negative-working radiation-sensitive compositions and imagable elements such as negative-working printing lithographic printing plate precursors that exhibit increased digital speed and good printability. The invention also relates to methods of using these imagable elements.

BACKGROUND OF THE INVENTION

Radiation-sensitive compositions are routinely used in the preparation of imagable materials including lithographic printing plate precursors. Such compositions generally include a radiation-sensitive component, a radically polymerizable component, an initiator system, and a binder, each of which has been the focus of research to provide various improvements in physical properties, imaging performance, and image characteristics.

Recent developments in the field of printing plate precursors concern the use of radiation-sensitive compositions that can be imaged by means of lasers or laser diodes, and more particularly, that can be imaged and/or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of from about 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

There are two possible ways of using radiation-sensitive compositions for the preparation of printing plates. For negative-working printing plates, exposed regions in the radiation-sensitive compositions are hardened and non-exposed regions are washed off during development. For positive-working printing plates, the exposed regions are dissolved in a developer and the non-exposed regions become an image.

Various negative-working radiation compositions and imagable elements containing reactive polymer binders are known in the art. Some of these compositions and elements are described for example in U.S. Pat. No. 6,569,603 (Furukawa), U.S. Pat. No. 6,309,792 (Hauck et al.), U.S. Pat. No. 6,582,882 (Pappas et al.), U.S. Pat. No. 6,893,797 (Munnelly et al.), and U.S. Pat. No. 6,787,281 (Tao et al.), U.S. Patent Application Publication 2003/0118939 (West et al.), and EP 1,079,276A1 (Lifka et al.), EP 1,182,033A1 (Fujimaki et al.), and EP 1,449,650A1 (Goto).

"On-press" development technology has become more prominent in recent years to avoid the use of traditional developers. On-press developable imagable elements that have been designed for this purpose are described, for example in U.S. Pat. No. 6,582,882 (Hayashi et al.), U.S. Pat. No. 6,899,994 (Huang et al.), and U.S. Pat. No. 7,005,234 (Hoshi et al.) and U.S. Patent Published Applications 2005/003285 (Hayashi et al.), 2005/026302 (Mitsumoto et al.), and 2006/0057492 (Kunita et al.). Such elements can be directly mounted on a press after imaging, and developed through contact with a lithographic printing ink, fountain solution, or both. Thus, a separate development step after imaging using a traditional developer is avoided. On-press imaging, in which the imagable element is both imaged and developed on-press, eliminates the need to mount the element in a separate imaging device.

Some negative-working compositions and imagable elements include iodonium borate salts in the initiator compositions as described for example, in copending and commonly assigned U.S. Ser. Nos. 11/138,026 (filed May 26, 2005 by Knight et al.), 11/356,518 (filed Feb. 17, 2006 by Tao et al.), and 11/349,376 (filed Feb. 7, 2006 by Tao et al.).

JP Kokai (published unexamined applications) 2002-116539 and 2005-062482 describe the use of borates, such as tetraarylborates, as initiators in negative-working compositions and imagable elements for making lithographic printing plates. These compounds are present as "free salts", meaning that they are not purposely bound to polymers. Polyborates are described as co-initiators in photopolymerizable composition in U.S. Pat. No. 6,087,062 (Cunningham et al.).

PROBLEM TO BE SOLVED

The various radiation sensitive compositions of the art can readily be used to prepare negative-working imagable elements, including those containing borates in the initiator compositions. In most cases, the known imagable elements are imagewise exposed and subjected to a preheat step before development to enhance crosslinking in the exposed regions of the imagable layer(s). Attempts to eliminate this preheat step have not been successful because that approach usually results in a loss in digital speed.

There is a need to develop a negative-working imagable element that can be used without a preheat step while maintaining or increasing digital speed and printability. It would also be desirable to design such imagable elements to be sensitive to various types of exposing radiation and to be developable either on-press or off-press.

SUMMARY OF THE INVENTION

The present invention provides a radiation-sensitive composition comprising:

a free radically polymerizable component, an initiator composition capable of generating radicals sufficient to initiate polymerization of the radically polymerizable component upon exposure to imaging radiation, and a polymeric binder that has a hydrophobic backbone and pendant salt groups that comprise a cation covalently attached to the hydrophobic backbone and a boron-containing anion forming a salt with the cation.

This invention also provides a negative-working imagable element comprising a substrate having thereon an imagable layer comprising:

a free radically polymerizable component, an initiator composition capable of generating radicals sufficient to initiate polymerization of the radically polymerizable component upon exposure to imaging radiation, and a polymeric binder that has a hydrophobic backbone and pendant salt groups that comprise a cation covalently attached to the hydrophobic backbone and a boron-containing anion forming a salt with the cation.

Further, this invention provides a method of making an imaged element comprising:

A) imagewise exposing the negative-working imagable element of the invention to form exposed and non-exposed regions, and B) with or without a preheat step, developing the imagewise exposed element to remove only the non-exposed regions.

We have found that the imagable elements of this invention provide a number of advantages including fast digital speed (high imaging sensitivity) and good printability (good shelf-life). These advantages can also be achieved in preferred embodiments in which the preheat step normally used between exposure and development, is omitted. These advantages are achieved for the use of the particular polymeric binders described herein having pendant salt groups in which a boron-containing anion (defined below) forms the salt groups with cations attached to the polymeric binder backbone.

DETAILED DESCRIPTION OF THE INVENTION

Definitions

Unless the context indicates otherwise, when used herein, the term "radiation-sensitive composition", "imagable element", and "printing plate precursor" are meant to be references to embodiments of the present invention.

In addition, unless the context indicates otherwise, the various components described herein such as "radically polymerizable component", "radiation absorbing compound", "polymeric binder", "additional polymeric binder", "initiator", "co-initiator", and similar terms also refer to mixtures of such components. Thus, the use of the articles "a", "an", and "the" are not necessarily meant to refer to only a single component.

Moreover, unless otherwise indicated, percentages refer to percents by dry weight.

The imagable elements of this invention are generally "single-layer" imagable elements by which we mean that the elements contain only one layer that is essential for imaging, but such elements may also include one or more layers under or over (such as a topcoat) the imagable layer for various purposes.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

"Graft" polymer or copolymer refers to a polymer having a side chain that has a molecular weight of from about 200.

The term "polymer" refers to high and low molecular weight polymers including oligomers and includes homopolymers and copolymers.

The term "copolymer" refers to polymers that are derived from two or more different monomers.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Radiation-Sensitive Compositions

One aspect of the present invention is a radiation-sensitive composition that may have any utility wherever there is a need for a coating that is polymerizable using suitable electromagnetic radiation, and particularly where it is desired to remove non-exposed regions of the coated and imaged composition. The radiation-sensitive compositions can be used to prepare imagable elements for use as printed circuit boards for integrated circuits, paint compositions, molding compositions, color filters, chemically amplified resists, imprint lithography, microelectronic and microoptical devices, and photomask lithography, and preferably printed forms such as lithographic printing plate precursors and imaged printing plates that are defined in more detail below.

The free radically polymerizable component used in the radiation-sensitive composition consists of one or more compounds that have one or more ethylenically unsaturated polymerizable or crosslinkable groups that can be polymerized or crosslinked using free radical initiation. For example, the free radically polymerizable component can be ethylenically unsaturated monomers, oligomers, and crosslinkable polymers, or various combinations of such compounds.

Thus, suitable ethylenically unsaturated compounds that can be polymerized or crosslinked include ethylenically unsaturated polymerizable monomers that have one or more of the polymerizable groups, including unsaturated esters of alcohols, such as (meth)acrylate esters of polyols. Oligomers and/or prepolymers, such as urethane (meth)acrylates, epoxide (meth)acrylates, polyester (meth)acrylates, polyether (meth)acrylates, free-radical crosslinkable polymers, and unsaturated polyester resins can also be used. In some embodiments, the radically polymerizable component may comprise carboxy groups.

Particularly useful radically polymerizable components include free-radical polymerizable monomers or oligomers that comprise addition polymerizable ethylenically unsaturated groups including multiple acrylate and methacrylate groups and combinations thereof, or free-radical crosslinkable polymers, or combinations of these classes of materials. More particularly useful radically polymerizable compounds include those derived from urea urethane (meth)acrylates or urethane (meth)acrylates having multiple polymerizable groups. For example, a most preferred radically polymerizable component can be prepared by reacting DESMODUR N100 aliphatic polyisocyanate resin based on hexamethylene diisocyanate (Bayer Corp., Milford, Conn.) with hydroxy acrylate and pentaerythritol triacrylate. Other preferred radically polymerizable compounds are available from Sartomer Company, Inc. such as SR399 (dipentaerythritol pentaacrylate), SR355 (di-trimethylolpropane tetraacrylate), SR295 (pentaerythritol tetraacrylate), and others that would be readily apparent to one skilled in the art.

Also useful are urea urethane (meth)acrylates and urethane (meth)acrylates described in U.S. Pat. No. 6,582,882 (noted above) and U.S. Pat. No. 6,899,994 (noted above), and in copending and commonly assigned U.S. Ser. No. 11/196,124 (filed Aug. 3, 2005 by Saraiya et al.) that is incorporated herein by reference.

Numerous other radically polymerizable compounds are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful radically polymerizable components are also described in EP 1,182,033A1 (noted above), beginning with paragraph [0170].

In some embodiments, the free radically polymerizable component comprises carboxy groups in an amount sufficient to provide an acid number greater than 0 mg KOH per grams of polymerizable component, and generally from 0 and up to and including 200 mg KOH per gram of the polymerizable component. Preferably, the acid number is from 0 and up to and including 100 mg KOH/gram of polymerizable component and more preferably, it is from 0 and up to and including 60 mg KOH/gram of polymerizable component.

Free radically polymerizable compounds containing carboxy groups can be prepared in a number of ways. For example, oligomers containing carboxy groups can be prepared as described in the teaching of Col. 4 (line 42) to Col. 5 (line 19) and Col. 7 (line 14) to Col. 8 (line 45) of U.S. Pat. No. 4,228,232 (Rousseau) that is incorporated herein by reference. The carboxy groups can be added to the oligomers preferably after addition of the free radical polymerizable moieties by reaction of remaining hydroxy groups on the oligomer backbone with a compound having free carboxy groups (such as a dicarboxylic acid or anhydride). The resulting oligomers can be polymerized to provide a desired carboxy-substituted polymer.

Alternatively, a poly(urea urethane)acrylate or poly(urethane)acrylate can be prepared from the reaction of a diisocyanate with a diol having free carboxy groups similarly to the preparation of allyl functional polyurethanes described in U.S. Pat. No. 5,919,600 (Huang et al.) that is incorporated by reference.

The radically polymerizable component is present in the radiation-sensitive composition in an amount sufficient to render the composition insoluble in an aqueous developer after exposure to radiation. This is generally from about 10 to about 70 weight % and preferably from about 20 to about 50 weight % based on the dry weight of the radiation-sensitive composition. For example, the weight ratio of radically polymerizable component to the polymeric binder (described below) is generally from about 5:95 to about 95:5, preferably from about 10:90 to about 90:10, and more preferably from about 30:70 to about 70:30.

The radiation-sensitive composition also includes an initiator composition that is capable of generating free radicals sufficient to initiate polymerization of the free radically polymerizable component upon exposure of the composition to imaging radiation. The initiator composition may be responsive, for example, to electromagnetic imaging radiation in the ultraviolet, visible and/or infrared spectral regions, corresponding to the spectral range of at least 150 nm and up to and including 1500 nm. UV and visible light sensitivity is generally at least 150 nm and up to and including 700 nm and in some embodiments, the radiation-sensitive composition is sensitive to imaging or exposing radiation of at least 250 nm and up to and including 450 nm (and preferably at least 375 nm and up to and including 450 nm) and includes an appropriate initiator composition for that imaging region. In other embodiments, the initiator composition is responsive to imaging or exposing infrared or near infrared radiation range of at least 600 nm and up to and including 1500 nm, and more preferably to imaging infrared radiation of at least 700 nm and up to and including 1200 nm and initiator compositions are used that are appropriate to that imaging range.

In general, suitable initiator compositions comprise compounds that include but are not limited to, amines (such as alkanol amines), thiol compounds, anilinodiacetic acids or derivatives thereof, N-phenyl glycine and derivatives thereof, N,N-dialkylaminobenzoic acid esters, N-arylglycines and derivatives thereof (such as N-phenylglycine), aromatic sulfonylhalides, trihalogenomethylsulfones, imides (such as N-benzoyloxyphthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof and other "co-initiators" described in U.S. Pat. No. 5,629,354 of West et al.), oxime ethers and oxime esters (such as those derived from benzoin), α-hydroxy or α-amino-acetophenones, alkyltriarylborates, trihalogenomethylarylsulfones, benzoin ethers and esters, peroxides (such as benzoyl peroxide), hydroperoxides (such as cumyl hydroperoxide), azo compounds (such as azo bis-isobutyronitrile), 2,4,5-triarylimidazolyl dimers (also known as hexaarylbiimidazoles, or "HABI's") as described for example in U.S. Pat. No. 4,565,769 (Dueber et al.), borate and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts). Other known initiator composition components are described for example in U.S Patent Application Publication 2003/0064318 (Huang et al.).

Particularly useful initiator composition components for UV and visible light sensitive radiation-sensitive compositions include hexaarylbiimidazoles (also known as 2,4,5-triarylimidazolyl dimers) such as, for example, 2,2'-bis(2-chlorophenyl)-4,4',5,5'-tetraphenyl-biimidazole and 2,2'-bis(o-chlorophenyl-4,4',5,5'-tetra(m-methoxyphenyl)biimidazole. The triazines noted below can be used with exposure to imaging radiation at about any wavelength including UV and visible radiation exposure. Other UV radiation-sensitive free-radical generating compounds include but are not limited to, trichloromethyl triazines as described, for example, in U.S. Pat. No. 4,997,745 (Kawamura et al.) and diaryliodonium salts.

Co-initiators can also be used initiators described above, and include metallocenes (such as titanocenes and ferrocenes), polycarboxylic acids, haloalkyl triazines, thiols or mercaptans (such as mercaptotriazoles), borate salts, and photooxidants containing a heterocyclic nitrogen that is substituted by an alkoxy or acyloxy group, as described in U.S. Pat. No. 5,942,372 (West et al.).

For IR-sensitive radiation-sensitive compositions, the preferred initiator compositions comprise an onium salt including but not limited to, a sulfonium, oxysulfoxonium, oxysulfonium, sulfoxonium, ammonium, selenonium, arsonium, phosphonium, diazonium, or halonium salt. Further details of useful onium salts, including representative examples, are provided in U.S. Patent Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.). For example, suitable phosphonium salts include positive-charged hypervalent phosphorus atoms with four organic substituents. Suitable sulfonium salts such as triphenylsulfonium salts include a positively-charged hypervalent sulfur with three organic substituents. Suitable diazonium salts possess a positive-charged azo group (that is —N≡N+). Suitable ammonium salts include a positively-charged nitrogen atom such as substituted quaternary ammonium salts with four organic substituents, and quaternary nitrogen heterocyclic rings such as N-alkoxypyridinium salts. Suitable halonium salts include a positively-charged hypervalent halogen atom with two organic substituents. The onium salts generally include a suitable number of negatively-charged counterions such as halides, hexafluorophosphate, thiosulfate, hexafluoroantimonate, tetrafluoroborate, sulfonates, hydroxide, perchlorate, n-butyltriphenyl borate, tetraphenyl borate, and others readily apparent to one skilled in the art.

The halonium salts are more preferred, and the iodonium salts are most preferred. In one preferred embodiment, the onium salt has a positively-charged iodonium, (4-methylphenyl)[4-(2-methylpropyl)phenyl]-moiety and a suitable negatively charged counterion. A representative example of such an iodonium salt is available as Irgacure® 250 from Ciba Specialty Chemicals (Tarrytown, N.Y.) that is (4-methylphenyl)[4-(2-methylpropyl)phenyl]iodonium hexafluorophosphate and is supplied in a 75% propylene carbonate solution.

Particularly useful boron components include organic boron salts that include an organic boron anion such as those described in the noted U.S. Pat. No. 6,569,603 that is paired with a suitable cation such as an alkali metal ion, an onium, or a cationic sensitizing dye. Useful onium cations include but are not limited to, ammonium, sulfonium, phosphonium, iodonium, and diazonium cations. Iodonium salts and particularly iodonium borates are particularly useful as initiator compounds in radiation-sensitive compounds that are designed for "on-press" development (described in more detail below). Representative iodonium borates useful in this invention include but are not limited to, bis(4-t-butylphenyl) iodonium tetraphenylborate, 4-methylphenyl-4'-hexylphenyliodonium tetraphenylborate, 2-methyl-4-t-butylphenyl-4'-methyphenyliodonium tetraphenylborate, 4-methylphenyl-4'-cyclohexylphenyliodonium tetraphenylborates. Mixtures of these compounds can also be used in the initiator compositions.

The radiation-sensitive composition may also include a mercaptan derivative such as a mercaptotriazole as a co-initiator. Such compounds include 3-mercapto-1,2,4-triazole, 4-methyl-3-mercapto-1,2,4-triazole, 5-mercapto-1-phenyl-1,2,4-triazole, 4-amino-3-mercapto-1,2,4,-triazole, 3-mercapto-1,5-diphenyl-1,2,4-triazole, and 5-(p-aminophenyl)-3-mercapto-1,2,4-triazole. Others are described in U.S. Pat. No. 6,884,568 (Timpe et al.). Various mercaptobenzimidazoles, mercaptobenzthiazoles, and mercaptobenzoxazoles may also be present.

Other useful initiator compositions include one or more azine compounds as described for example in U.S. Pat. No. 6,936,384 (Munnelly et al.). These compounds are organic heterocyclic compounds containing a 6-membered ring formed from carbon and nitrogen atoms. Azine compounds include heterocyclic groups such as pyridine, diazine, and triazine groups, as well as polycyclic compounds having a pyridine, diazine, or triazine substituent fused to one or more aromatic rings such as carbocyclic aromatic rings. Thus, the azine compounds include, for example, compounds having a quinoline, isoquinoline, benzodiazine, or naphthodiazine substituent. Both monocyclic and polycyclic azine compounds are useful.

Especially useful azine compounds are triazine compounds that include a 6-membered ring containing 3 carbon atoms and 3 nitrogen atoms such as those described in U.S. Pat. Nos. 6,309,792 (Hauck et al.), 6,010,824 (Komano et al.), 5,885,746 (Iwai et al), 5,496,903 (Watanabe et al.), and 5,219,709 (Nagasaka et al.).

The azinium form of azine compounds can also be used if desired. In azinium compounds, a quaternizing substituent of a nitrogen atom in the azine ring is capable of being released as a free radical. The alkoxy substituent that quaternizes a ring nitrogen atom of the azinium nucleus can be selected from among a variety of alkoxy substituents.

Halomethyl-substituted triazines, such as trihalomethyl triazines, are particularly useful in the initiator composition. Representative compounds of this type include but are not limited to, 1,3,5-triazine derivatives such as those having 1 to 3-$CX_3$ groups wherein X independently represent chlorine or bromine atoms, including polyhalomethyl-substituted triazines and other triazines, such as 2,4-trichloromethyl-6-methoxyphenyl triazine, 2-phenyl-4,6-bis(trichloromethyl)-s-triazine, 2,4,6-tris(trichloromethyl)-s-triazine, 2-methyl-4,6-bis(trichloromethyl)-s-triazine, 2-(styryl-4,6-bis (trichloromethyl)-s-triazine, 2-(p-methoxystyryl)-4,6-bis (trichloromethyl)-s-triazine, 2-(4-methoxy-naphtho-1-yl)-4, 6-bis(trichloromethyl)-s-triazine, 2-(4-ethoxynaphtho-1yl)-4,6-bis(trichloromethyl)-s-triazine, and 2-(4-(2-ethoxyethyl)-naphtho-1-yl)-4,6-bis(trichloromethyl)-s-triazine], 2-(4-methylthiophenyl)-4,6-bis(trichloromethyl)-2-triazine, 2-(4-chlorophenyl-4,6-bis(trichloromethyl)-2-triazine, 2,4,6-tri(trichloromethyl)-2-triazine, and 2,4,6-tri (tribromomethyl)-2-triazine.

The azine compounds and particularly the triazine compounds may be used alone or in combination with one or more co-initiators such as titanocenes, mono- and polycarboxylic acids, hexaarylbisimidazoles, as described for example in U.S. Pat. No. 4,997,745 (Kawamura et al.).

Thus, several initiator/co-initiator combinations can be used in various embodiments of the present invention, namely:

a) a triazine as described above in combination with a co-initiator that is an N-aryl, S-aryl, or O-aryl polycarboxylic acid with at least 2 carboxy groups at least one of which is bonded to the nitrogen, oxygen, or sulfur atom of the aryl moiety (such as aniline diacetic acid and derivatives thereof) as described above, b) a triazine as described above in combination with a co-initiator that is a mercaptan derivative as described above, c) an iodonium salt (such as an iodonium borate) as described above in combination with a co-initiator that is a metallocene (for example a titanocene or ferrocene) as described for example in U.S. Pat. No. 6,936,384 (noted above), and d) an iodonium salt (such as an iodonium borate) as described above in combination with a co-initiator that is a mercaptotriazole as described above.

The initiator composition including one or more initiator compounds is generally present in the radiation-sensitive composition in an amount of from about 0.5% to about 30%, based on the total solids of the radiation-sensitive composition or the dry weight of the coated imagable layer. Preferably, the initiator composition is present in an amount of from about 2% to about 20 weight %. In the preferred embodiments, one or more diaryliodonium borate compounds generally comprise from about 10 to about 100% of the initiator composition. In the coated imagable layers of the imagable elements, the initiator composition is generally present in an amount of from about 0.01 $g/m^2$ and preferably from about 0.03 to about 0.3 $g/m^2$.

The polymeric binders used in the radiation-sensitive composition have a hydrophobic backbone and pendant salt groups that comprise a cation covalently attached to the hydrophobic backbone and a boron-containing anion forming a salt with the cation. In general, such cations can include ammonium, sulfonium, or phosphonium ions, or mixtures thereof Preferably, they are ammonium or phosphonium ions, and most preferably, they are ammonium ions.

More particularly, the boron-containing anion can be represented by the following Structure (I):

 (I)

wherein $R_1$, $R_2$, $R_3$, and $R_4$ are independently substituted or unsubstituted alkyl groups having 1 to 12 carbon atoms (such as methyl, ethyl, n-propyl, iso-propyl, n-butyl, isobutyl, t-butyl, all pentyl isomers, 2-methylpentyl, all hexyl isomers, 2-ethylhexyl, all octyl isomers, 2,4,4-trimethylpentyl, all nonyl isomers, all decyl isomers, all undecyl isomers, all dodecyl isomers, methoxymethyl, and benzyl), substituted or unsubstituted carbocyclic aryl groups having 6 to 10 carbon atoms in the aromatic ring (such as phenyl, p-methylphenyl, 2,4-methoxyphenyl, naphthyl, and pentafluorophenyl groups), substituted or unsubstituted alkenyl groups having 2 to 12 carbon atoms (such as ethenyl, 2-methylethenyl, allyl, vinylbenzyl, acryloyl, and crotonotyl groups), substituted or unsubstituted alkynyl groups having 2 to 12 carbon atoms (such as ethynyl, 2-methylethynyl, and 2,3-propynyl groups), substituted or unsubstituted cycloalkyl groups having 3 to 8 carbon atoms in the ring structure (such as cyclopropyl, cyclopentyl, cyclohexyl, 4-methylcyclohexyl, and cyclooctyl groups), or substituted or unsubstituted heterocyclyl groups having 5 to 10 carbon, oxygen, sulfur, and nitrogen atoms (including both aromatic and non-aromatic groups, such as substituted or unsubstituted pyridyl, pyrimidyl, furanyl, pyrrolyl, imidazolyl, triazolyl, tetrazoylyl, indolyl, quinolinyl, oxadiazolyl, and benzoxazolyl groups). Alternatively, two or more of $R_1$, $R_2$, $R_3$, and $R_4$ can be joined together to form a heterocyclic ring with the boron atom, such rings having up to 7 carbon, nitrogen, oxygen, or nitrogen atoms.

Preferably, $R_1$, $R_2$, $R_3$, and $R_4$ are independently substituted or unsubstituted alkyl or aryl groups as defined above, and more preferably, at least 3 of $R_1$, $R_2$, $R_3$, and $R_4$ are the same or different substituted or unsubstituted aryl groups (such as substituted or unsubstituted phenyl groups). Most preferably, all of $R_1$, $R_2$, $R_3$, and $R_4$ are the same or different substituted or unsubstituted aryl groups and most preferably, all of the groups are the same substituted or unsubstituted phenyl group. More preferably, the substituents of the boron-containing anion are all substituted or unsubstituted aryl groups, or one of them is an alkyl, for example, alkyltriarylborates or tetraarylborates.

More particularly, the polymeric binders can be represented by the following Structure (II):

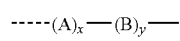 (II)

wherein A represents recurring units comprising the pendant salt groups comprising the cation and boron-containing anion, and B represents recurring units other than those represented by A.

In Structure (II), x is from about 0.5 to 30 mol %, and y is from 70 to about 99.5 mol %. Preferably, x is from about 0.5 to about 15 mol %, and y is from about 85 to about 99.5 mol %.

Generally, B represents recurring units derived from one or more (meth)acrylic acid esters, (meth)acrylamides, (meth)acrylonitriles, poly(alkylene oxide)methyl ether (meth)acrylates, vinyl carbazole, styrene and styrenic derivatives thereof, N-substituted maleimides, maleic anhydride, vinyl acetate, vinyl ketones, vinyl pyridine, N-vinyl pyrrolidones, 1-vinylimidazole, (meth)acrylic acid, vinyl polyalkylsilanes, and combinations thereof.

Preferably, B represents recurring units derived from (meth)acrylic acid esters, (meth)acrylonitriles, styrene and styrene derivatives, vinyl carbazole, and (meth)acrylic acid, or combinations of two or more of these monomers.

Some particularly useful polymeric binders represented by Structures (I) and (II) are identified below as Polymers B and D in the Examples.

The polymeric binders represented by Structure (I) are generally present in the radiation-sensitive composition (and imagable layer) in an amount of from about 20 to about 70 weight %, based on the total composition or imagable layer solids. Preferably, the amount is from about 20 to about 50 weight %.

The polymeric binders of Structure (I) generally have a molecular weight of from about 2,000 to about 1,000,000 and preferably from about 10,000 to about 200,000. The acid value (mg KOH/g) of the polymeric binder is generally from about 0 to about 400 as determined using known methods.

These polymeric binders can be prepared using the preparatory methods described in the Synthetic Examples B and D presented below before the Examples. Polymerization is carried out using many available starting materials and known reaction conditions. The monomers containing a cation covalently attached to the hydrophobic backbone and a boron-containing anion forming a salt with the cation can be prepared using generally the same conditions and procedure shown below in Synthetic Example 1. Other details about preparing such polymers are provided for example by Sarker et al. *Macromolecules* 1996, 29, 8047-8052.

The radiation-sensitive composition can additionally include additional polymeric binders known in the art for use in negative-working radiation-sensitive compositions. These additional polymeric binders generally have a molecular weight of from about 2,000 to about 1,000,000 and preferably from about 10,000 to about 200,000. The acid value (mg KOH/g) of the polymeric binder is generally from about 20 to about 400 as determined using known methods. However, when a mixture of polymeric binders is used, at least 25 weight % (preferably at least 40 weight %) of the total polymeric binders is composed of those represented by Structure (II) defined above.

Examples of additional polymeric binders include but are not limited to, (meth)acrylic acid ester resins, polyvinyl acetals, phenolic resin, polymers derived from styrene, N-substituted cyclic imides or maleic anhydrides, such as those described in EP 1,182,033 (noted above) and U.S. Pat. No. 6,309,792 (noted above), U.S. Pat. No. 6,352,812 (Shimazu et al.), U.S. Pat. No. 6,569,603 (noted above), and U.S. Pat. No. 6,893,797 (noted above). Also useful are the vinyl carbazole polymers having pendant N-carbazole moieties as described in copending and commonly assigned U.S. Ser. No. 11/356,518 (filed Feb. 17, 2006 by Tao et al.) and polymers having pendant reactive vinyl groups as described in copending and commonly assigned U.S. Ser. No. 11/349,376 (filed Feb. 7, 2006 by Tao et al), both of which applications are incorporated herein by reference.

Other useful additional polymeric binders are dispersible, developable, or soluble in water or water/solvent mixtures such as fountain solutions. Such polymeric binders include polymeric emulsions, dispersions, or graft polymers having pendant poly(alkyleneoxide) side chains that can render the imagable elements as "on-press" developable. Such polymeric binders are described for example in U.S. Pat. Nos. 6,582,882 and 6,899,994 (both noted above). In some instances, these additional polymeric binders are present in the imagable layer as discrete particles.

Other useful additional polymeric binders have hydrophobic backbones and comprise both of the following a) and b) recurring units, or the b) recurring units alone:

a) recurring units having pendant cyano groups attached directly to the hydrophobic backbone, and b) recurring units having pendant groups comprising poly (alkylene oxide) segments.

These additional polymeric binders comprise poly(alkylene oxide) segments and preferably poly(ethylene oxide) segments. These polymers can be graft copolymers having a main chain polymer and poly(alkylene oxide) pendant side chains or segments or block copolymers having blocks of (alkylene oxide)-containing recurring units and non(alkylene oxide)-containing recurring units. Both graft and block copolymers can additionally have pendant cyano groups attached directly to the hydrophobic backbone. The alkylene oxide constitutional units are generally $C_1$ to $C_6$ alkylene oxide groups, and more typically $C_1$ to $C_3$ alkylene oxide groups. The alkylene portions can be linear or branched or substituted versions thereof. Poly(ethylene oxide) and poly (propylene oxide) segments are preferred and poly(ethylene oxide) segments are most preferred.

In some embodiments, the additional polymeric binders contain only recurring units comprising poly(alkylene oxide) segments, but in other embodiments, the additional polymeric binders comprise recurring units comprising the poly (alkylene oxide) segments as well as recurring units having pendant cyano groups attached directly to the hydrophobic backbone. By way of example only, such recurring units can comprise pendant groups comprising cyano, cyano-substituted alkylene groups, or cyano-terminated alkylene groups. Recurring units can also be derived from ethylenically unsaturated polymerizable monomers such as acrylonitrile, methacrylonitrile, methyl cyanoacrylate, ethyl cyanoacrylate, or a combination thereof. However, cyano groups can be introduced into the polymer by other conventional means. Examples of such cyano-containing polymeric binders are described for example in U.S. Patent Application Publication 2005/003285 (Hayashi et al.).

By way of example, such additional polymeric binders can be formed by polymerization of a combination or mixture of suitable ethylenically unsaturated polymerizable monomers or macromers, such as:

A) acrylonitrile, methacrylonitrile, or a combination thereof,

B) poly(alkylene oxide) esters of acrylic acid or methacrylic acid, such as poly(ethylene glycol)methyl ether acrylate, poly(ethylene glycol)methyl ester methacrylate, or a combination thereof, and C) optionally, monomers such as acrylic acid, methacrylic acid, styrene, hydroxystyrene, acrylate esters, methacrylate esters, acrylamide, methacrylamide, or a combination of such monomers.

The amount of the poly(alkylene oxide) segments in such additional polymeric binders is from about 0.5 to about 60 weight %, preferably from about 2 to about 50 weight %, more preferably from about 5 to about 40 weight %, and most preferably from about 5 to about 20 weight %. The amount of (alkylene oxide) segments in the block copolymers is generally from about 5 to about 60 weight %, preferably from about 10 to about 50 weight %, and more preferably from about 10 to about 30 weight %. It is also possible that the polymeric binders having poly(alkylene oxide) side chains are present in the form of discrete particles.

The additional polymeric binders described above can be present in an amount of from about 10 to about 75%, and preferably from about 20 to about 50%, based on the total solids content of the radiation-sensitive composition, or the dry weight of the imagable layer prepared therefrom.

In some embodiments, it may be useful to include "secondary" additional polymeric binders in combination with the polymeric binders described above. Such additional secondary polymeric binders include acrylic-urethane hybrid polymers that are commercially available in dispersions from Air Products and Chemicals, Inc. (Allentown, Pa.) under the tradename Hybridur, for example, the Hybridur 540, 560, 570, 580, 870, and 878 acrylic-urethane hybrid dispersions. The additional secondary polymeric binder may be present in the radiation-sensitive composition in an amount of from about 5 to about 40 weight % based on the total solids content of the composition, or the dry coated weight of the imagable layer.

The radiation-sensitive composition generally includes one or more radiation absorbing compounds, or sensitizers, that absorb imaging radiation, or sensitize the composition to imaging radiation having a $\lambda_{max}$ of from the UV to the IR region of the electromagnetic spectrum, that is, at least 150 nm and up to and including 1500 nm. Some sensitizers can be used at any wavelength, but most sensitizers are optimally useful within certain wavelength ranges. For example, some sensitizers are optimal for use at an exposing wavelength of at least 250 nm and up to and including 650 nm (UV to visible). Other sensitizers are particularly optimal for use for exposure to UV radiation of at least 250 nm and up to and including 450 nm, while still others are optimal for use at an exposure wavelength of at least 650 nm and up to and including 1500 nm (near IR and IR).

In some preferred embodiments, the radiation-sensitive composition contains a UV sensitizer where the free-radical generating compound is UV radiation sensitive (that is at least 250 nm and up to and including 450 nm), thereby facilitating photopolymerization. Typical UV radiation-sensitive free-radical generating compounds are described above. In some preferred embodiments, the radiation sensitive compositions are sensitized to "violet" radiation in the range of at least 375 nm and up to and including 450 nm. Useful sensitizers for such compositions include certain pyrilium and thiopyrilium dyes and 3-ketocoumarins (particularly in combination with a polycarboxylic acid free radical generating compound, such as anilino-N,N-diacetic acid).

Sensitizers that absorb in the visible region of the electromagnetic spectrum (that is at least 400 nm and up to and including 650 nm) can also be used. Examples of such sensitizers are well known in the art and include the compounds described in Cols. 17-22 of U.S. Pat. No. 6,569,603 (noted above). Other useful visible and UV-sensitive sensitizing compositions include a cyanine dye, diaryliodonium salt, and a co-initiator (as described above) as described in U.S. Pat. No. 5,368,990 (Kawabata et al.).

Other useful sensitizers for the violet/visible region of sensitization are the 2,4,5-triaryloxazole derivatives as described in WO 2004/074930 (Baumann et al.). These compounds can be used alone or with a co-initiator as described above, and especially with the 1,3,5-triazines described above or with thiol compounds. Useful 2,4,5-triaryloxazole derivatives can be represented by the Structure G-$(Ar_1)_3$ wherein $Ar_1$ is the same or different, substituted or unsubstituted carbocyclic aryl group having 6 to 12 carbon atoms in the ring, and G is a furan, oxazole, or oxadiazole ring. The Ar$_1$ groups can be substituted with one or more halo, substituted or unsubstituted alkyl, substituted or unsubstituted cycloalkyl, substituted or unsubstituted aryl, amino (primary, secondary, or tertiary), or substituted or unsubstituted alkoxy or aryloxy groups. Thus, the aryl groups can be substituted with one or more R'$_1$ through R'$_3$ groups, respectively, that are independently hydrogen or a substituted or unsubstituted alkyl group having from 1 to 20 carbon atoms (such as methyl, ethyl, iso-propyl, n-hexyl, benzyl, and methoxymethyl groups) substituted or unsubstituted carbocyclic aryl group having 6 to 10 carbon atoms in the ring (such as phenyl, naphthyl, 4-methoxyphenyl, and 3-methylphenyl groups), substituted or unsubstituted cycloalkyl group having 5 to 10 carbon atoms in the ring, a —N(R'$_4$)(R'$_5$) group, or a —OR'$_6$ group wherein R'$_4$ through R'$_6$ independently represent substituted or unsubstituted alkyl or aryl groups as defined above. Preferably, at least one of R'$_1$ through R'$_3$ is an —N(R'$_4$)(R'$_5$) group wherein R'$_4$ and R'$_5$ are the same or different alkyl groups. Preferred substituents for each Ar$_1$ group include the same or different primary, secondary, and tertiary amines and more preferably they are the same dialkylamines.

Still another class of useful violet/visible radiation sensitizers includes compounds represented by the Structure Ar$_1$-G-Ar$_2$ wherein Ar$_1$ and Ar$_2$ are the same or different substituted or unsubstituted aryl groups having 6 to 12 carbon atoms in the ring, or Ar$_2$ can be an arylene-G-Ar$_1$ or arylene-G-Ar$_2$ group, and G is a furan, ozazole, or oxadiazole ring. Ar$_1$ is the same as defined above, and Ar$_2$ can be the same or different aryl group as Ar$_1$. "Arylene" can be any of the aryl groups defined for Ar$_1$ but with a hydrogen atom removed to render them divalent in nature.

Additional useful "violet"-visible radiation sensitizers are the compounds described in WO 2004/074929 (Baumann et al.). These compounds comprise the same or different aromatic heterocyclic groups connected with a spacer moiety that comprises at least one carbon-carbon double bond that is conjugated to the aromatic heterocyclic groups, and are represented in more detail by Formula (I) of the noted publication.

In embodiments of this invention that are sensitive to infrared radiation, the radiation-sensitive compositions generally comprise an infrared radiation absorbing compound ("IR absorbing compounds") that absorbs radiation of at least 700 nm and up to and including 1500 nm and preferably of at least 750 nm and up to and including about 1200 nm. For imagable elements designed for on-press development, it is particularly useful for such IR absorbing compounds to be used in combination with onium salts to enhance polymerization of the polymerizable component and to produce a more durable printing plate.

Useful IR-sensitive radiation absorbing compounds include carbon blacks and other IR-absorbing pigments and various IR-sensitive dyes ("IR dyes"). Examples of suitable IR dyes include but are not limited to, azo dyes, squarilium dyes, croconate dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.) that is incorporated herein by reference. Cyanine dyes may also be useful in combination with a trihalomethyl triazine and an organoboron salt as described for example in U.S. Pat. No. 5,496,903 (Watanabe et al.).

A general description of one class of suitable cyanine dyes is shown by the formula in paragraph [0026] of WO 2004/101280 (Munnelly et al.), and two specific examples of useful IR absorbing compounds are identified below with the Examples as IR Dyes 1 and 2.

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (DeBoer).

Useful IR absorbing compounds include carbon blacks including carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful.

The radiation absorbing compound can be present in the radiation-sensitive composition in an amount generally of from about 0.5% to about 30% and preferably from about 2 to about 15%, based on total solids in the composition that also corresponds to the total dry weight of the imagable layer. Alternatively, the amount can be defined by an absorbance in the range of from about 0.05 to about 3, and preferably of from about 0.1 to about 1.5, in the dry film as measured by reflectance UV-visible spectrophotometry. The particular amount needed for this purpose would be readily apparent to one skilled in the art, depending upon the specific compound used.

The radiation-sensitive composition can further comprise one or more nonionic phosphate acrylates, each of which has a molecular weight generally greater than 250 and preferably at least 300 and up to and including 1000. By "nonionic" we mean that the phosphate acrylates not only are neutral in charge but they have no internal positive or negative charges. Thus, they are not internal salts or salts formed with an external cation or anion. Moreover, by "phosphate acrylate" we also meant to include "phosphate methacrylates" and other derivatives having substituents on the vinyl group in the acrylate moiety.

It is also preferred that each phosphate moiety is connected to an acrylate moiety by an alkyleneoxy chain, that is a -(alkylene-O)$_m$— chain composed of at least one alkyleneoxy unit, in which the alkylene moiety has 2 to 6 carbon atoms and can be either linear or branched and m is 1 to 10. Preferably, the alkyleneoxy chain comprises ethyleneoxy units, and m is from 2 to 8 and more preferably, m is from 3 to 6. The alkyleneoxy chains in a specific compound can be the same or different in length and have the same or different alkylene group.

Representative nonionic phosphate acrylates useful in this manner include but are not limited to, ethylene glycol methacrylate phosphate (available from Aldrich Chemical Co.), a phosphate of 2-hydroxyethyl methacrylate that is available as Kayamer PM-2 from Nippon Kayaku (Japan), a phosphate of caprolactone modified 2-hydroxyethyl methacrylate that is available as Kayamer PM-21 (Nippon Kayaku, Japan), and an ethylene glycol methacrylate phosphate with 4-5 ethoxy groups that is available as Phosmer PE from Uni-Chemical Co., Ltd. (Japan).

The radiation-sensitive composition can also include a poly(alkylene glycol) or an ether or ester thereof that has a molecular weight of from about 200 to about 4000 (preferably from about 500 to about 2000). This additive can be present in an amount of from about 2 to about 50 weight % (preferably from about 5 to about 30%) based on the total solids content of the composition, or the total dry weight of the imagable layer. Particularly useful additives of this type include, but are not limited to, one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth)acrylate, and polyethylene glycol mono methacrylate. Also useful are SR9036 (ethoxylated (30) bisphenol A dimethacrylate), CD9038 (ethoxylated (30) bisphenol A diacrylate), and SR494 (ethoxylated (5) pentaerythritol tetraacrylate), and similar compounds all of which that can be obtained from Sartomer Company, Inc.

The radiation-sensitive composition can also include a poly(vinyl alcohol), a poly(vinyl pyrrolidone), poly(vinyl imidazole), or polyester in an amount of up to 20 weight % based on the total solids content of the composition, or the total dry weight of the imagable layer.

The radiation-sensitive composition can also include a variety of optional compounds including but not limited to, dispersing agents, humectants, biocides, plasticizers, surfactants for coatability or other properties, viscosity builders, dyes or colorants to allow visualization of the written image, pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones).

Imagable Elements

The imagable elements are formed by suitable application of a radiation-sensitive composition as described above to a suitable substrate to form an imagable layer. This substrate can be treated or coated in various ways as described below prior to application of the radiation-sensitive composition. Preferably, there is only a single imagable layer comprising the radiation-sensitive composition of this invention. If the substrate has been treated to provide an "interlayer" for improved adhesion or hydrophilicity, the applied radiation-sensitive composition is generally considered the "top" or outermost layer. These interlayers, however, are not considered "imagable layers". While there is usually no need to apply what is conventionally known as an overcoat (such as an oxygen impermeable topcoat) to the imagable layer(s) as described in WO 99/06890 (Pappas et al.), it can be used if desired. Such overcoat layers can comprise one or more water-soluble polymers such as poly(vinyl alcohol), poly(vinyl pyrrolidone), and poly(vinyl imidazole), or mixtures thereof, and generally are present at a dry coating weight of from about 0.1 to about 4 $g/m^2$.

The substrate generally has a hydrophilic surface, or from about a surface that is more hydrophilic than the applied radiation-sensitive composition on the imaging side. The substrate comprises a support that can be composed of any material that is conventionally used to prepare imagable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both flat surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A preferred substrate is composed of an aluminum support that may be treated using techniques known in the art, including physical graining, electrochemical graining, chemical graining, and anodizing (such as with nitric, sulfuric, or phosphoric acid). Preferably, the aluminum sheet is electrochemically grained and then anodized using phosphoric acid or sulfuric acid and conventional procedures.

An interlayer may be formed by treatment of the aluminum support with, for example, a silicate, dextrine, calcium zirconium fluoride, hexafluorosilicic acid, phosphate solution containing a fluoride such as sodium fluoride (PF), poly(vinyl phosphonic acid) (PVPA), vinyl phosphonic acid copolymer, poly(acrylic acid), or acrylic acid copolymer. Preferably, the aluminum support is mechanically-grained, phosphoric acid-anodized, and treated with poly(acrylic acid) using known procedures to improve surface hydrophilicity.

The thickness of the substrate can be varied but should be sufficient to sustain the wear from printing and thin enough to wrap around a printing form. Preferred embodiments include a treated aluminum foil having a thickness of from about 100 to about 600 μm.

The backside (non-imaging side) of the substrate may be coated with antistatic agents and/or slipping layers or a matte layer to improve handling and "feel" of the imagable element.

The substrate can also be a cylindrical surface having the radiation-sensitive composition applied thereon, and thus be an integral part of the printing press. The use of such imaging cylinders is described for example in U.S. Pat. No. 5,713,287 (Gelbart).

The radiation-sensitive composition can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder). Preferably, the radiation-sensitive composition is applied as the outermost layer.

Illustrative of such manufacturing methods is mixing the radically polymerizable component, initiator composition, radiation absorbing compound, polymeric binder(s), and any other components of the radiation-sensitive composition in a suitable organic solvent [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Preferred coating solvents and representative imagable layer formulations are described in the Examples below. After proper drying, the coating weight of the imagable layer is generally from about 0.1 to about 5 $g/m^2$, preferably from about 0.5 to about 3.5 $g/m^2$, and more preferably from about 0.5 to about 1.5 $g/m^2$.

Layers can also be present under the imagable layer to enhance developability or to act as a thermal insulating layer. The underlying layer should be soluble or dispersible in the developer and preferably have a relatively low thermal conductivity coefficient.

The imagable elements have any useful form including but not limited to, printing plate precursors, printing cylinders, printing sleeves and printing tapes (including flexible printing webs). Preferably, the imagable members are printing plate precursors that can be of any useful size and shape (for example, square or rectangular) having the requisite imagable layer disposed on a suitable substrate. Printing cylinders and sleeves are known as rotary printing members having the substrate and imagable layer in a cylindrical form. Hollow or solid metal cores can be used as substrates for printing sleeves.

Imaging Conditions

During use, the imagable element is exposed to a suitable source of radiation such as UV, visible light, near-infrared, or infrared radiation, depending upon the radiation absorbing compound present in the radiation-sensitive composition, at a wavelength of from about 150 nm to about 1500 nm. Preferably, imaging is carried out using a source of UV radiation having a $\lambda_{max}$ of from about 350 to about 450 nm, or an infrared laser at a wavelength of from about 700 nm to about 1400 nm. The laser used to expose the imagable element is preferably a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1060 to about 1120 nm.

The imaging apparatus can be configured as a flatbed recorder or as a drum recorder, with the imagable member mounted to the interior or exterior cylindrical surface of the drum. Examples of useful UV-imaging apparatus are models of Luxel V and Vx imagesetters that are available from Fuji (Japan) that contains laser diodes that emit radiation at a wavelength of about 405 nm. Other suitable imaging sources include the :Advantage and :Avalon imagesetters (available from Agfa-Gevaert, Belgium) and the MAKO NEWS platesetter (available from ECRM, Tewksbury, Mass.).

The imaging apparatus can function solely as a platesetter or it can be incorporated directly into a lithographic printing press. In the latter case, printing may commence immediately after imaging and development, thereby reducing press set-up time considerably. The imaging apparatus can be configured as a flatbed recorder or as a drum recorder, with the imagable member mounted to the interior or exterior cylindrical surface of the drum. An example of an useful imaging apparatus is available as models of Creo Trendsetter® imagesetters available from Eastman Kodak Company that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging with infrared radiation can be carried out generally at imaging energies of at least 20 $mJ/cm^2$ and up to and including 500 $mJ/cm^2$, preferably at least 50 and up to and including 300 $mJ/cm^2$ depending upon the sensitivity of the imagable layer.

Imaging radiation in the UV to visible region of the spectrum, and particularly the UV region (for example at least 250 nm and up to and including 450 nm), can be carried out generally using energies of at least 0.01 $mJ/cm^2$ and up to and including 0.5 $mJ/cm^2$, and preferably at least 0.02 and up to and including about 0.1 $mJ/cm^2$. It would be desirable, for example, to image the UV/visible radiation-sensitive imagable elements at a power density in the range of at least 0.5 and up to and including 50 $kW/cm^2$ and preferably of at least 5 and up to and including 30 $kW/cm^2$.

While laser imaging is preferred in the practice of this invention, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

Development and Printing

Without the need for a pre-heat step after imaging, the imaged elements can be developed "off-press using a conventional developer.

For off-press development, the developer commonly includes surfactants, chelating agents (such as salts of ethylenediaminetetraacetic acid), organic solvents (such as benzyl alcohol), or alkaline components (such as inorganic metasilicates, organic metasilicates, hydroxides, and bicarbonates). The pH of the aqueous alkaline developers is preferably from about 7 to about 14 and preferably above 12. The imaged elements are generally developed using conventional processing conditions.

Useful alkaline aqueous developers include 3000 Developer, 9000 Developer, GOLDSTAR Developer, GREENSTAR Developer, ThermalPro Developer, PROTHERM Developer, MX1813 Developer, and MX1710 Developer (all available from Eastman Kodak Company). These compositions also generally include surfactants, chelating agents (such as salts of ethylenediaminetetraacetic acid), and alkaline components (such as inorganic metasilicates, organic metasilicates, hydroxides, and bicarbonates).

Organic solvent-containing developers can also be used and are generally single-phase solutions of one or more organic solvents that are miscible with water. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 and up to 15% based on total developer weight. Such organic solvent-containing developers can be neutral, alkaline, or slightly acidic in pH, and have a pH of from about 6.5 to about 9.5. Preferably, they are alkaline and have a pH of from about 7.5 to about 9.5.

Representative organic solvent-containing developers include ND-1 Developer, Developer 980, 2 in 1 Developer, 955 Developer, and 956 Developer (all available from Eastman Kodak Company).

For off-press development, the developer generally is applied to the imaged element by rubbing or wiping the outer layer with an applicator containing the developer. Alternatively, the imaged element can be brushed with the developer or the developer may be applied by spraying the outer layer with sufficient force to remove the exposed regions. Still again, the imaged element can be immersed in the developer. In all instances, a developed image is produced in a lithographic printing plate having excellent resistance to press room chemicals.

Following this off-press development, the imaged element can be rinsed with water and dried in a suitable fashion. The dried element can also be treated with a conventional gumming solution (preferably gum arabic). In addition, a postbake operation can be carried out, with or without a blanket exposure to UV or visible radiation. Alternatively, a post-UV floodwise exposure (without heat) can be used to enhance the performance of the imaged element.

Alternatively, the imaged element can be developed off-press using a developer solution that consists essentially of water (preferably warm water) and optionally containing an alcohol or alcohol-replacement additive where water makes up the predominant portion of the developer solution. This simplified developer may also include a surfactant. Development using essentially water may be facilitated with modest rubbing using a cloth, sponge, or brush.

Using a heated developer may facilitate development in some embodiments. For example, the developer solution consisting essentially of water can be heated and used at a temperature greater than 30° C. and preferably greater than 35° C. Such development can be carried out using the commercial Aquascrubber 34 plate processor that is available from Precision Lithograining (South Hadley, Mass.).

In other embodiments, off-press development can be accomplished by contacting the imaged element with a commercial plate cleaner such as Prisco LPC (available from Printer's Service, Newark, N.J.). Development with such solutions may also be facilitated using modest rubbing with a cloth, sponge, or brush. In addition, this development can be carried out on-press where the imagable element is either developed, or both imaged and developed on-press (see below).

Following off-press development with essentially water or the plate cleaner, the imaged element can be rinsed with water and dried in a suitable fashion. The dried element can also be treated with a conventional gumming solution (preferably gum arabic), with or without additional water. In addition, a postbake operation can be carried out, with or without a blanket exposure to UV or visible radiation.

Printing can be carried out by applying a lithographic ink and fountain solution to the printing surface of the imaged and off-press developed element. The fountain solution is taken up by the non-exposed regions, that is, the surface of the hydrophilic substrate revealed by the imaging and development steps, and ink is taken up by the imaged (exposed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means.

Some imagable elements of this invention may be developable "on-press". This type of development avoids the use of the developing solutions described above. The imaged element is directed mounted onto the press wherein the non-exposed regions in the imagable layer are removed by application of a suitable fountain solution, lithographic ink, or both, in any order, during the initial impressions in printing. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.).

Alternatively, the imagable element can be both imaged and developed on-press.

The following examples are provided to illustrate the practice of the invention but are by no means intended to limit the invention in any manner.

EXAMPLES

The components and materials used in the examples and analytical methods used in evaluation were as follows. Unless otherwise indicated, the components can be obtained from Aldrich Chemical Company (Milwaukee, Wis.):

AIBN represents azoisobutrolnitrile, for example, Vazo-64 from DuPont (Wilmington, Del.).

Byk® 307 is a polyethoxylated dimethyl polysiloxane copolymer that was obtained from Byk Chemie (Wallingford, Conn.) in a 10 wt. % PGME solution.

Byk® 336 is a 25 wt. % solution of a modified dimethyl polysiloxane copolymer in xylene/methoxypropyl acetate that was obtained from Byk Chemie.

Elvacite® 4026 is a 10 wt. % solution in MEK of highly branched poly(methyl methacrylate) in methanol that was obtained from Lucite International, Inc. (Cordova, Tenn.).

Equinox process black ink, #15, was obtained from Graphic Ink Company (Salt Lake City, Utah).

Initiator A is a 75 wt. % solution of iodonium (4-methylphenyl)[4-(2-methylpropyl)phenyl]-, hexafluorophosphate in propylene carbonate that was obtained from Ciba Specialty Chemicals (Tarrytown, N.Y.).

Irganox® 1035 was thiodiethylene bis(3,5-di-t-butyl-4-hydroxyhydrocinnamate) and was obtained from Ciba Specialty Chemicals Company in a 5 wt. % MEK solution.

IR Dye 1 is an IR dye is represented by the following formula:

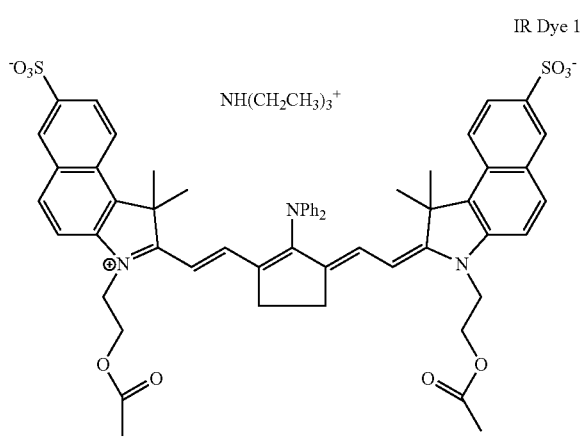

IR Dye 1

IRT is an IR Dye that was obtained from Showa Denko (Japan).

Klucel® M is a hydroxypropyl cellulose thickener used as a 1 wt. % aqueous solution that was obtained from Hercules (Heverlee, Belgium).

MEK represents methyl ethyl ketone.

Mercapto-3-triazole represents mercapto-triazole-1H,2,4 that was obtained from PCAS (Longjumeau, France).

Oligomer A is a urethane acrylate that was prepared by reacting Desmodur® N100 with hydroxyethyl acrylate and pentaerythritol triacrylate (80% by weight in MEK).

PEGDA is a polyethylene glycol diacrylate (MW=700).

PEGMA is a poly(ethylene glycol) methyl ether methacrylate, 50 wt. % solution in water, typical Mn 2,080.

PGME represents 1-methoxy-2-propanol and it is also known as Dowanol® PM.

Phosmer PE is an ethylene glycol methacrylate phosphate with 4-5 ethylene glycol units that was obtained from Uni-Chemical Co., Ltd. (Japan).

Pigment A (951) is a 27% solids dispersion of 7.7 parts of a polyvinyl acetal derived from poly(vinyl alcohol) acetalized with acetaldehyde, butyraldehyde, and 4-formylbenzoic acid, 76.9 parts of Irgalith Blue GLVO (Cu-phthalocyanine C.I. Pigment Blue 15:4) and 15.4 parts of Disperbyk® 167 dispersant (Byk Chemie) in 1-methoxy-2-propanol.

SR399 is dipentaerythritol pentaacrylate that was obtained from Sartomer Company, Inc. (Exton, Pa.) in a 40 wt. % MEK solution.

Varn Litho Etch 142W is an ingredient in fountain solutions that was obtained from Varn International (Addison, Ill.).

Varn PAR (alcohol sub) is an ingredient in fountain solutions that was also obtained from Varn International.

955 Developer is a solvent-based developer that can be obtained from Eastman Kodak Company.

Synthetic Example 1

Preparation of Monomer A,
[3-(methacryloylamino)propyl]trimethylammonium tetraphenylborate Sodium tetraphenylborate (13.68 g, Aldrich Chemical Co.) was dissolved in 300 g of water in a 500 ml beaker marked as Container A. [3-(Methacryloylamino)propyl]trimethylammonium chloride (17.64 g, 50% in water, Aldrich Chemical Co.) was diluted in 500 g of water in a 1000 ml beaker marked as Container B. The solution in Container A was slowly (over about 10 minutes) added to the solution in Container B while severely stirring by a Silverson L4R. A white precipitate was formed and the mixture was stored in a refrigerator for 2 hours. After a first filtration, the white solid was collected and washed with 100 ml of water. The product was obtained from a second filtration and dried under ambient temperature over the weekend and then at 35° C. in an oven for 4 hours to provide 20 g of a white solid.

Synthetic Example 2

Preparation of Polymer A

AIBN (1.6 g), methyl methacrylate (20 g), acrylonitrile (24 g), vinyl carbazole (18 g, from Polymer Dajac), methacrylic acid (18 g), and DMAC (320 g) were placed in a 1000-ml 3-necked flask, equipped with magnetic stirring, temperature controller, and $N_2$ inlet. The mixture was heated to 60° C. and stirred under $N_2$ protection overnight (about 16 hours). The % non-volatiles were measured at about 20%. The nitrogen protection was removed, and 5.2 g of KOH in 40 g of water were added. A viscous liquid was formed. After stirring the mixture for 10 minutes, 13.3 g of allyl bromide was added and the mixture was stirred at 55° C. for 3 hours. A 36% solution of HCl (12 g) in 40 g of DMAC was added to the flask and stirred for another 3 hours. The reaction mixture was filtered to remove inorganic salt formed. The filtrate was then slowly dropped to a mixture of 12 liters of water with 20 g of the 36% HCl solution while stirring. The resulting precipitate was filtered and washed with 2000 ml of propanol, followed by another 2000 ml of water. A fine white powder was obtained after filtration, and was dried at 40° C. for 5 hours to provide 63 g of polymer solid.

Synthetic Example 3

Preparation of Polymer B

AIBN (0.8 g), Monomer A (5 g) from Synthetic Example 1, methyl methacrylate (8.4 g), acrylonitrile (10 g), vinyl carbazole (7.6 g, from Polymer Dajac), methacrylic acid (9 g), and DMAC (160 g) were placed in a 500-ml 3-necked flask, equipped with magnetic stirring, temperature controller, and $N_2$ inlet. The mixture was heated to 60° C. and stirred under $N_2$ protection overnight (about 16 hours). The % non-volatiles were measured at about 20%. The nitrogen protection was removed, and 2.6 g of KOH in 20 g of water were added. A viscous liquid was formed. After stirring the mixture for 10 minutes, 6.65 g of allyl bromide was added and the mixture was stirred at 55° C. for 3 hours. A 36% HCl solution (6 g) in 20 g of DMAC was added to the flask and stirred for another 3 hours. The reaction mixture was filtered to remove inorganic salt that had formed. The filtrate was then slowly dropped into a mixture of 6 liters of water with 10 g of 36% HCl solution with stirring. The resulting precipitate was filtered, and washed with 1000 ml of propanol, followed by another 1000 ml of water. A fine white powder was obtained after filtration. The powder was dried at room temperature for 5 hours and then at 40° C. overnight to provide 30.5 g of polymer solid.

Synthetic Example 4

Preparation of Polymer C

A solution of PEGMA (20 g) dissolved in a mixture of deionized water (74.8 g) and n-propanol (241.4 g), was charged into a 1000 ml four-necked flask, and was heated slowly to slight reflux (76° C.) under $N_2$ atmosphere. A premixture of styrene (20 g), acrylonitrile (70 g), and Vazo-64 (0.7 g) was added over a 2-hour period. Six hours later, another aliquot of Vazo-64 (0.5 g) was added. The temperature was raised to 80° C. Subsequently, two more aliquots of Vazo-64 (0.35 g each) were added over a period of 6 hours. After a reaction for 19 hours, the conversion to copolymer was >98% based on a determination of percent non-volatiles. The weight ratio of PEGMA/styrene/acrylonitrile was 10:20:70 and n-propanol/water ratio was 76:24. The residual acrylonitrile in solution was 0.5% based on determination by $^1H$ NMR.

Synthetic Example 5

Preparation of Polymer D

PEGMA (10 g, MW=2000, 50% in water), Monomer A (5 g) from Synthetic Example 1, deionized water (35 g), and n-propanol (120 g) was charged into a 500 ml 3-necked flask. The flask was heated slowly to 75° C. under $N_2$ atmosphere. Styrene (9 g), acrylonitrile (31 g), and AIBN (0.35 g), in an equalizing funnel, were added over two hours (the solution became hazy in 30 minutes). Two hours later, the reaction mixture was cooled to room temperature by applying a water bath, and the reaction mixture was allowed to stand without stirring overnight. AIBN (0.2 g) was added the next day after reaction temperature was raised to 75° C. and stirring of the reaction mixture was continued under a $N_2$ atmosphere for 4 hours. Another 0.2 g of AIBN was added and reaction was continued for another 3 hours. When 24.3% solids were reached, the reaction was stopped by bringing the flask to room temperature and the resulting dispersion was kept in amber bottle for further use.

Comparative Example 1

An imagable layer coating solution was prepared by mixing 0.41 g of Polymer A, 0.28 g of Oligomer A, 0.47 g of SR399, 0.1 g of Initiator A, 0.013 g of Phosmer PE, 0.16 g of Byk® 307, 0.12 g of Pigment 951, 0.09 g of PEGDA, 0.43 g of Irganox® 1035, 10.13 g of PGME, and 4.83 g of MEK. The solution was coated on an electrically-grained and sulfuric acid anodized aluminum substrate that had been post-treated with poly(vinyl phosphoric acid) using a wire-wound rod and then dried for approximately 90 seconds residence time in a Ranar Conveyor oven set at 90° C., providing in a dry coating weight of about 1.0 g/m$^2$.

The resulting imagable element (printing plate precursor) was exposed to 60 seconds of UV radiation through a mask having a T-14 scale. The imaged element was then processed with 33% of 955 Developer in water in a tray at 25° C. and was then inked with a balance of Equinox process black lithographic ink and a fountain solution containing Varn Litho Etch 142W at 3 ounces/gallon (22.5 g/liter) and PAR alcohol replacement at 3 ounces/gallon (22. g/liter). No image was retained in the exposed regions and the printing plate did not accept ink.

Example 1

An imagable layer coating solution was prepared by mixing 0.41 g of Polymer B, 0.28 g of Oligomer A, 0.47 g of SR399, 0.1 g of Initiator A, 0.013 g of Phosmer PE, 0.16 g of Byk 307, 0.12 g of Pigment 951, 0.09 g of PEGDA, 0.43 g of Irganox® 1035, 10.13 g of PGME, and 4.83 g of MEK. The solution was coated on an electrically-grained and sulfuric acid anodized aluminum substrate that had been post-treated with poly(vinyl phosphoric acid) using a wire-wound rod and then dried for approximately 90 seconds residence time in a Ranar Conveyor oven set at 90° C., providing a dry coating weight of about 1.0 g/m$^2$.

The resulting imagable element (printing plate precursor) was exposed to 60 seconds of UV radiation through a mask having a T-14 scale. The imaged element was then processed with 33% 955 Developer in water in a tray at 25° C. and was then inked with a balance of Equinox process black lithographic ink and a fountain solution containing Varn Litho Etch 142W at 3 ounces/gallon (22.5 g/liter) and PAR alcohol replacement at 3 ounces/gallon (22.5 g/liter). The resulting printing plate was fully ink-receptive at step 3 on the Scale T-14 control.

Comparative Example 2

An imagable layer coating solution was prepared by dissolving 1.20 g of Polymer A, 0.83 g of Oligomer A, 1.28 g of SR399, 0.22 g of Initiator A, 0.094 g of IRT 1, 0.50 g of Irganox® 1035 (5% in MEK), 0.34 g of Pigment 951, 0.28 g of PEGDA, 0.038 g of Phosmer PE, and 0.32 g of 10% Byk® 307 in 29.9 g of PGME and 15.0 g of MEK. A electrically-grained and sulfuric acid anodized aluminum substrate that had been post-treated with sodium hexafluorophosphate was coated with above solution providing a dry coating weight of about 1.3 g/m$^2$ when properly dried at 170° F. (about 77° C.) for about 2 minutes on a rotating drum.

The resulting single layer imagable element (printing plate precursor) was exposed to 830 nm IR laser at 4.5 W power and varying drum speed (250-60 RPM) on a CREO Trendsetter® 3244x image setter (Eastman Kodak Company, Burnaby, British Columbia, Canada), and was developed with 33% of 955 Developer in water in a tray at 25° C. An imaging exposure of 211 mJ/cm$^2$ was not sufficient to achieve a stable solid density. A 60 second UV exposure was also done on the same printing plate and a solid step 1 on the T-14 scale was obtained. The printing plates that were incubated in either 48° C. or 38° C./80% humidity for 5 days showed similar digital speed and clean background.

These imagable elements were then coated with an overcoat formulation containing 16.3 g of 9.7% Airvol® 203 poly(vinyl alcohol) in water, 1.4 g of 20% poly(vinyl imidazole) in water, 1.2 g of 2-propanol, and 11.1 g of water. After applying the overcoat formulation by using a wire-wound rod and then drying for approximately 1 minute in a Ranar conveyor oven set at about 100° C., an overcoat having a dry coverage of about 0.35 g/m$^2$ resulted. The resulting imagable element with overcoat was exposed to 830 nm IR laser at 180 mJ/cm$^2$, developed with 33% 955 Developer in water in a tray at 25° C., mounted on a Miehle sheet-fed printing press using a wear ink containing 1.5% calcium carbonate, and used to produce about 28,000 good impressions.

Example 2

An imagable layer coating solution was prepared by dissolving 1.20 g of Polymer B, 0.83 g of Oligomer A, 1.28 g of SR399, 0.22 g of Initiator A, 0.094 g of IRT 1, 0.50 g of Irganox® 1035 (5% in MEK), 0.34 g of Pigment 951, 0.28 g of PEGDA, 0.038 g of Phosmer PE, and 0.32 g of 10% Byk® 307 in 29.9 g of PGME and 15.0 g of MEK. A electrically-grained and sulfuric acid anodized aluminum substrate that had been post-treated with sodium hexafluorophosphate was coated with above solution providing a dry coating weight of about 1.3 g/m² when properly dried at 170° F. (about 77° C.) for about 2 minutes on a rotating drum.

The resulting single-layer imagable element (printing plate precursor) was exposed to 830 nm IR laser at 4.5 W power and varying drum speed (250-60 RPM) on a CREO Trendsetter® 3244x image setter and was developed with 33% 955 Developer in water in a tray at 25° C. The minimum energy to achieve a stable solid density and clean background was about 140 mJ/cm². A 60 second UV exposure was also done on the same printing plate and a solid step 6 on the T-14 scale was obtained. The printing plates incubated in either 48° C. or 38° C./80% humidity for 5 days showed similar digital speed and clean background.

These imagable elements were then coated with an overcoat formulation containing 16.3 g of 9.7% Airvol® 203 poly(vinyl alcohol) in water, 1.4 g of 20% poly(vinyl imidazole) in water, 1.2 g of 2-propanol, and 11.1 g of water. After applying the overcoat formulation by using a wire-wound rod and then drying for approximately 1 minute in a Ranar conveyor oven set at about 100° C., an overcoat having a dry coverage of about 0.35 g/m² resulted. The resulting imagable element with overcoat was exposed to 830 nm IR laser at 180 mJ/cm², developed with 33% 955 Developer in water in a tray at 25° C., mounted on a Miehle sheet-fed printing press using a wear ink containing 1.5% calcium carbonate, and used to produce about 30,000 good impressions.

Comparative Example 3

An imagable layer coating solution was prepared by mixing 3.19 g of Polymer C (24% solids), 0.69 g of Oligomer A, 0.20 g of SR399, 0.09 g of Initiator A, 0.09 g of dye 1, 0.03 g of Phosmer PE, 0.99 g of Elvacite® 4026, 0.20 g of Byk® 336, 2.20 g of Klucel® M, 0.04 g of mercapto-3-triazole, and 0.13 g of PEGDA in 21.81 g of n-propanol, 13.23 g of MEK, and 6.89 g of water. A electrically-grained and sulfuric acid anodized aluminum substrate that had been post-treated with poly(vinyl phosphoric acid) was coated with above solution, providing a dry coating weight of about 1.0 g/m² when properly dried at 170° F. (about 77° C.) for about 2 minutes on a rotating drum.

The resulting imagable element (printing plate precursor) was exposed to 830 nm IR laser at 5.0 W power and varying drum speed (240-40 RPM) on a CREO Trendsetter® 3244x image setter and was then mounted directly on a A.B. Dick printing press charged with a balance of Equinox process black lithographic ink and a fountain solution containing Varn Litho Etch 142W at 3 ounces/gallon (22.5 g/liter) and PAR alcohol replacement at 3 ounces/gallon (22. g/liter). A good image was produced at 100 mJ/cm².

Another imagable element of this type was exposed at 100 mJ/cm² and mounted on a Miehle sheet-fed printing press using a wear ink containing 1.5% calcium carbonate to provide about 10,000 good impressions.

Example 3

An imagable layer coating solution was prepared by mixing 3.19 g of Polymer D (24% solids), 0.69 g of Oligomer A, 0.20 g of SR399, 0.09 g of Initiator A, 0.09 g of dye 1, 0.03 g of Phosmer PE, 0.99 g of Elvacite® 4026, 0.20 g of Byk® 336, 2.20 g of Klucel® M, 0.04 g of mercapto-3-triazole, and 0.13 g of PEGDA in 21.81 g of n-propanol, 13.23 g of MEK, and 6.89 g of water. A electrically-grained and sulfuric acid anodized aluminum substrate that had been post-treated with poly(vinyl phosphoric acid) was coated with above solution, providing a dry coating weight of about 1.0 g/m² when properly dried at 170° F. (about 77° C.) for about 2 minutes on a rotating drum.

The resulting imagable element (printing plate precursor) was exposed to 830 nm IR laser at 5.0 W power and varying drum speed (240-40 RPM) on a CREO Trendsetter® 3244x image setter, and was then mounted directly on a A.B. Dick printing press charged with a balance of Equinox process black lithographic ink and a fountain solution containing Varn Litho Etch 142W at 3 ounces/gallon (22.5 g/liter) and PAR alcohol replacement at 3 ounces/gallon (22.5 g/liter). A good image was produced at 50 mJ/cm².

Another imagable element of this type was exposed at 100 mJ/cm² and mounted on a Miehle sheet-fed printing press using a wear ink containing 1.5% calcium carbonate to provide at least 28,000 good impressions.

Example 4

An imagable layer coating solution was prepared by mixing 3.19 g of Polymer D (24% solids), 0.69 g of Oligomer A, 0.20 g of SR399, 0.09 g of Initiator A, 0.09 g of IR Dye 1, 0.03 g of Phosmer PE, 0.99 g of Elvacite® 4026, 0.20 g of Byk® 336, 2.20 g of Klucel® M, 0.04 g of mercapto-3-triazole, and 0.13 g of PEGDA in 21.81 g of n-propanol, 13.23 g of MEK, and 6.89 g of water. A mechanically-grained and phosphoric acid anodized aluminum substrate that had been post-treated with poly(acrylic acid) was coated with above solution, providing a dry coating weight of about 1.0 g/m² when properly dried at 170° F. (about 77° C.) for about 2 minutes on a rotating drum.

The resulting imagable element (printing plate precursor) was exposed to 830 nm IR laser at 5.0 W power and varying drum speed (240-40 RPM) on a CREO Trendsetter® 3244x image setter, and was then mounted directly on a A.B. Dick printing press charged with a balance of Equinox process black lithographic ink and a fountain solution containing Varn Litho Etch 142W at 3 ounces/gallon (22.5 g/liter) and PAR alcohol replacement at 3 ounces/gallon (22.5 g/liter). A good image was produced at 50 mJ/cm². The printing plate precursor was also incubated either at 38° C. and 80% relative humidity, or at 50° C. for 5 days. No significant change was seen after incubation in terms of image quality.

Another element of this type was exposed at 100 mJ/cm² and then mounted on a Miehle sheet-fed printing press using a wear ink containing 1.5% calcium carbonate to produce at least 28,000 good impressions.

The invention has been described in detail with particular reference to certain preferred embodiments thereof, but it will be understood that variations and modifications can be effected within the spirit and scope of the invention.

The invention claimed is:

1. A method of making an imaged element comprising:
   A) imagewise exposing a negative-working imagable element having a hydrophilic substrate having thereon an imagable layer to imaging radiation having a maximum wavelength of from about 700 to about 1200 nm to form exposed and non-exposed regions in the imaged imagable layer, and
   B) with or without a preheat step, developing said imagewise exposed element off-press using an aqueous alkaline or organic solvent-containing developer having a pH of at least 6.5, a plate cleaner, or heated aqueous developer consisting essentially of water, to remove only said non-exposed regions of the imaged imagable layer, said negative-working imagable element being sensitive to radiation at a wavelength of from about 700 to about 1200 nm, and comprising the hydrophilic substrate having a hydrophilic surface and having thereon the imagable layer comprising:

a free radically polymerizable component, an initiator composition capable of generating radicals sufficient to initiate polymerization of said radically polymerizable component upon exposure to said imaging radiation, and a polymeric binder that has a hydrophobic backbone and pendant salt groups that comprise a cation covalently attached to said hydrophobic backbone and a boron-containing anion forming a salt with said cation.

2. The method of claim 1 wherein said imagewise exposing step A is carried out at an energy level of from about 20 to about 300 mJ/cm².

3. The method of claim 1 wherein said initiator composition comprises an onium or triazine.

4. The method of claim 1 wherein said cation is an ammonium, sulfonium, or phosphonium ion, and said boron-containing anion is represented by the following Structure (I):

(I)

wherein $R_1$, $R_2$, $R_3$, and $R_4$ are independently alkyl, aryl, alkenyl, alkynyl, cycloalkyl, or heterocyclyl groups, or two or more of $R_1$, $R_2$, $R_3$, and $R_4$ can be joined together to form a heterocyclic ring with the boron atom.

5. The method of claim 4 wherein said cation is an ammonium ion and said boron-containing anion is an alkyltriarylborate or tetraarylborate.

6. The method of claim 1 wherein said polymeric binder represents from about 20 to about 70 weight %, based on the total imagable layer weight.

7. The method of claim 1 wherein said polymeric binder is represented by the following Structure (II):

(II)

wherein A represents recurring units comprising said pendant salt groups comprising said cation and boron-containing anion, B represents recurring units other than those represented by A, x is from about 0.5 to 30 mol %, and y is from 70 to about 99.5 mol %.

8. The method of claim 7 wherein x is from about 0.5 to about 15 mol %, and y is from about 85 to about 99.5 mol %.

9. The method of claim 7 wherein B represents recurring units derived from one or more (meth)acrylic acid esters, (meth)acrylamides, (meth)acrylonitriles, poly(alkylene oxide) methyl ether (meth)acrylates, vinyl carbazole, styrene and styrenic derivatives thereof, N-substituted maleimides, maleic anhydride, vinyl acetate, vinyl ketones, vinyl pyridine, N-vinyl pyrrolidones, 1-vinylimidazole, (meth)acrylic acid, and vinyl polyalkylsilanes.

10. The method of claim 1 wherein said initiator composition comprises an onium salt, said free radically polymerizable component comprises an ethylenically unsaturated free-radical polymerizable monomer or oligomer, or a free-radical crosslinkable polymer, and said radiation absorbing compound is an infrared radiation absorbing compound.

* * * * *